United States Patent
Jeong (10) Patent No.: US 10,937,841 B2
(45) Date of Patent: Mar. 2, 2021

(54) FLEXIBLE DISPLAY APPARATUS AND METHOD OF MANUFACTURING THE SAME

(71) Applicant: SAMSUNG DISPLAY CO., LTD., Yongin-si (KR)

(72) Inventor: Chulwoo Jeong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 210 days.

(21) Appl. No.: 15/429,468

(22) Filed: Feb. 10, 2017

(65) Prior Publication Data

US 2017/0236877 A1   Aug. 17, 2017

(30) Foreign Application Priority Data

Feb. 12, 2016   (KR) .................. 10-2016-0016364

(51) Int. Cl.
*H01L 27/32* (2006.01)
*H01L 27/12* (2006.01)
*H01L 51/00* (2006.01)
*H01L 51/50* (2006.01)
*H01L 51/52* (2006.01)

(52) U.S. Cl.
CPC .......... *H01L 27/323* (2013.01); *H01L 27/124* (2013.01); *H01L 27/3246* (2013.01); *H01L 51/0097* (2013.01); *H01L 51/5056* (2013.01); *H01L 51/5072* (2013.01); *H01L 51/5088* (2013.01); *H01L 51/5092* (2013.01); *H01L 51/5253* (2013.01); *H01L 27/1218* (2013.01); *H01L 2251/5338* (2013.01); *Y02E 10/549* (2013.01); *Y02P 70/50* (2015.11)

(58) Field of Classification Search
CPC ................ H01L 33/20; H01L 51/0097; H01L 2251/5338; G02F 1/133305; G02F 1/1652; G02F 2201/56
See application file for complete search history.

(56) References Cited

U.S. PATENT DOCUMENTS 9,323,291 B2   4/2016   Oh et al.
9,430,180 B2   8/2016   Hirakata et al.
9,939,846 B2   4/2018   Namkung et al.
(Continued)

FOREIGN PATENT DOCUMENTS

JP   2015-118373 A   6/2015
KR   10-2012-0138071 A   12/2012
(Continued)

OTHER PUBLICATIONS https://dictionary.cambridge.org/us/dictionary/english/over; 2018.*

*Primary Examiner* — Nilufa Rahim
(74) *Attorney, Agent, or Firm* — Kile Park Reed & Houtteman PLLC (57) ABSTRACT

A flexible display apparatus includes a flexible substrate having a main area having an apex at which a first side and a second side meet, a first area that shares the first side with the main area, and a second area that shares the second side with the main area, wherein a first angle of the first area and a second angle of the second area that share the apex are acute angles, and a display unit arranged over the main area, the first area, and the second area of the flexible substrate.

20 Claims, 6 Drawing Sheets

(56) References Cited

U.S. PATENT DOCUMENTS

| | | | |
|---|---|---|---|
| 2010/0065832 A1* | 3/2010 | Sugimoto | H01L 27/3293 257/40 |
| 2012/0320329 A1 | 12/2012 | Lee et al. | |
| 2013/0034685 A1* | 2/2013 | An | H01L 51/524 428/121 |
| 2013/0342429 A1* | 12/2013 | Choi | H05K 13/00 345/30 |
| 2014/0016284 A1 | 1/2014 | Hack et al. | |
| 2015/0021570 A1 | 1/2015 | Kim et al. | |
| 2016/0329520 A1 | 11/2016 | Namkung et al. | |

FOREIGN PATENT DOCUMENTS

| | | |
|---|---|---|
| KR | 10-2014-0120509 A | 10/2014 |
| KR | 10-2015-0094989 | 8/2015 |
| KR | 10-2016-0130921 A | 11/2016 |

\* cited by examiner

FLEXIBLE DISPLAY APPARATUS AND METHOD OF MANUFACTURING THE SAME

CROSS-REFERENCE TO RELATED APPLICATION

Korean Patent Application No. 10-2016-0016364, filed on Feb. 12, 2016, in the Korean Intellectual Property Office, and entitled: "Flexible Display Apparatus and Method of Manufacturing the Same," is incorporated by reference herein in its entirety.

BACKGROUND

1. Field

One or more embodiments relate to a flexible display apparatus and a method of manufacturing the same, and more particularly, to a flexible display apparatus for preventing a defect in a bending area and a method of manufacturing the flexible display apparatus.

2. Description of the Related Art

From among display apparatuses, an organic light-emitting display apparatus has drawn the attention as a next-generation display apparatus due to its advantages such as a wide viewing angle, a high contrast ratio, and a speedy response rate. Generally, when the organic light-emitting display apparatus is manufactured, thin film transistors and organic light-emitting devices are formed on a substrate, and the organic light-emitting devices emit light during operation of the organic light-emitting apparatus. The organic light-emitting display apparatus is used as a display unit of a small product, e.g., a cellular phone, or a display unit of a large product, e.g., a television (TV).

Recently, as there is a growing interest in flexible display apparatuses from among organic light-emitting display apparatuses, research on flexible display apparatuses has been actively performed. A glass substrate or a synthetic resin may be used to manufacture a flexible substrate for a flexible display apparatus.

SUMMARY

According to one or more embodiments, a flexible display apparatus may include a flexible substrate including a main area having an apex at which a first side and a second side meet, a first area that shares the first side with the main area, and a second area that shares the second side with the main area, wherein a first angle of the first area and a second angle of the second area that share the apex are acute angles; and a display unit arranged over the main area, the first area, and the second area of the flexible substrate.

The first side may correspond to a first bending line that bends the main area and the first area at a preset angle, and wherein the second side corresponds to a second bending line that bends the main area and the second area at a preset angle.

The main area may have a third angle that is an internal angle including the apex, and wherein a sum of the first angle, the second angle, and the third angle is 180°.

The display unit may be spaced apart from an edge of the flexible substrate by a predetermined distance.

The main area may include a corner area including the apex at which the first side and the second side meet, and wherein the display unit is not arranged in the corner area.

The corner area may have a triangular shape including the apex.

The flexible display apparatus may further include a touch screen panel arranged over the display unit and corresponding to a shape of the flexible substrate.

The flexible display apparatus may further include a cover window arranged over the touch screen panel and corresponding to a shape of the flexible substrate.

The display unit may be integrally formed with the main area, the first area, and the second area of the flexible substrate.

The main area of the flexible substrate may have a polygonal shape, the first and second areas being continuous with and surrounding the main area, and each of the first and second areas has a trapezoidal shape, each of the first and second areas being bent with respect to the main area at a non-zero angle.

According to one or more embodiments, a method of manufacturing a flexible display apparatus may include preparing for a flexible substrate comprising a main area having an apex at which a first side and a second side meet, a first area that shares the first side with the main area, and a second area that shares the second side with the main area, wherein a first angle of the first area and a second angle of the second area that share the apex are acute angles; and forming a display unit arranged integrally with the main area, the first area, and the second area of the flexible substrate.

The method may further include preparing for a mother flexible substrate of a polygonal shape having sides and corners at which the sides meet; and forming a chamfer by cutting the corners of the mother flexible substrate.

The forming of the chamfer may include: cutting a straight line such that the corners are cut into a triangular shape.

The main area may have a third angle that is an internal angle including the apex, and wherein a sum of the first angle, the second angle, and the third angle is 180°.

In the forming of the display unit, the display unit may be spaced apart from an edge of the flexible substrate by a predetermined distance.

The main area may include a corner area including the apex, and wherein, in the forming of the display unit, the display unit is not arranged in the corner area.

The corner area may have a triangular shape including the apex.

The method may further include forming a touch screen panel corresponding to a shape of the flexible substrate over the display unit.

The method may further include forming a cover window corresponding to a shape of the flexible substrate over the touch screen panel.

The method may further include bending the main area and the first area at a preset angle by using the first side corresponding to a first bending line; and bending the main area and the second area at a preset angle by using the second side corresponding to a second bending line.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

While such terms as "first" and "second" may be used to describe various components, such components must not be limited to the above terms. The above terms are used only to distinguish one component from another. The singular forms "a," "an," and "the" used herein are intended to include the plural forms as well, unless the context clearly indicates otherwise. It will be understood that the terms such as "include," "comprise," and "have" used herein specify the presence of stated features or components, but do not preclude the presence or addition of one or more other features or components.

The x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

When an embodiment may be implemented differently, a specific process order may be performed differently from the described order. For example, two consecutively described processes may be performed substantially at the same time or performed in an order opposite to the described order. As used herein, the term "and/or" includes any and all combinations of one or more of the associated listed items.

Figure 1:
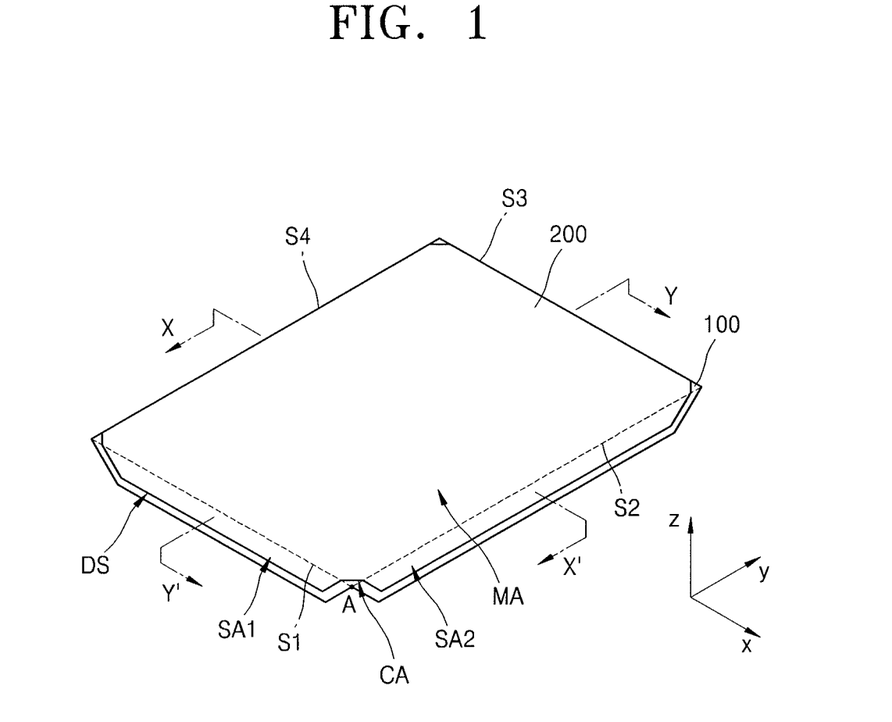
FIG. 1 illustrates a schematic perspective view of a flexible display apparatus according to an embodiment.
Figure 2:
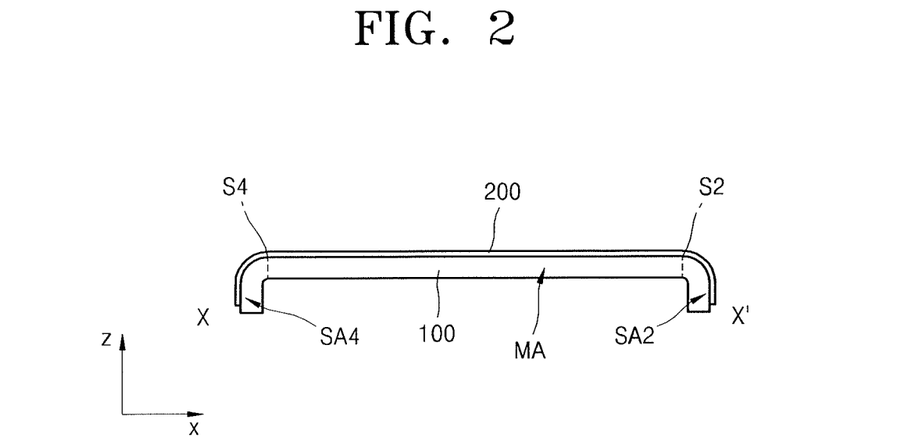
FIG. 2 illustrates a schematic cross-sectional view of the flexible display apparatus of FIG. 1 along line X-X'.
Figure 3:
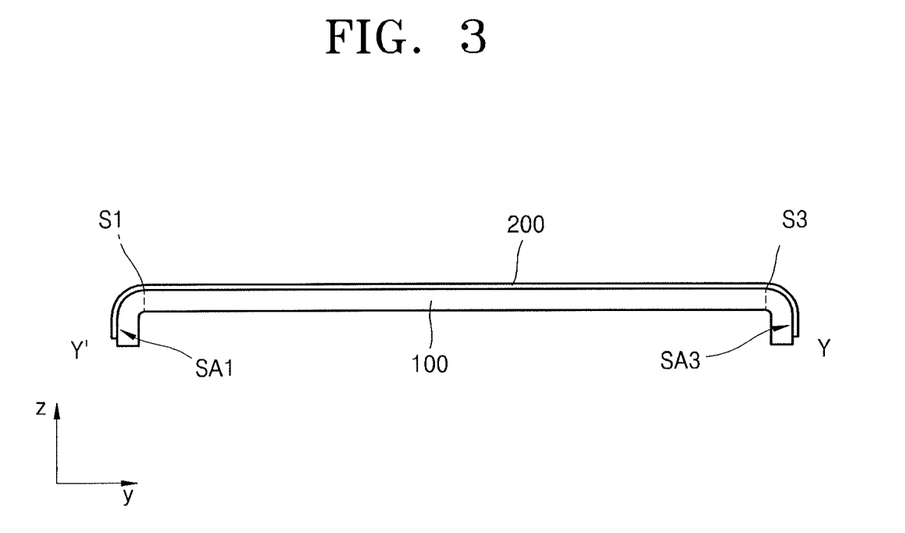
FIG. 3 illustrates a schematic cross-sectional view of the flexible display apparatus of FIG. 1 along line Y-Y'.

FIG. 1 is a schematic perspective view of a flexible display apparatus according to an embodiment. FIG. 2 is a schematic cross-sectional view of the flexible display apparatus of FIG. 1 taken along line X-X'. FIG. 3 is a schematic cross-sectional view of the flexible display apparatus of FIG. 1 taken along line Y-Y'.

Referring to FIGS. 1 through 3, a flexible display apparatus according to an embodiment may include a flexible substrate 100 having a main area MA, a first area SA1, and a second area SA2. The flexible display apparatus may further include a display unit 200 arranged over the flexible substrate 100.

The flexible substrate 100 may have a flexible property and may include various materials, e.g., a thin film glass material, a metal material, or a plastic material. Examples of the plastic material may include polyethylene naphthalate (PEN), polyethylene terephthalate (PET), polyimide (PI), etc.

In the present embodiment, the flexible substrate 100 may include the main area MA, and the first area SA1 and the second area SA2 that are adjacent to the main area MA. The first area SA1 and the second area SA2 may be understood to be positioned in side surfaces of the main area MA, and may be bent at a preset angle with respect to the main area MA. For example, as illustrated in FIGS. 1-3, the main area MA of the flexible substrate 100 may have a polygonal shape, e.g., a rectangular shape, and the first and second areas SA1 and SA2 may be continuous with the main area MA, e.g., extend from an edge of the main area MA to surround the main area MA. For example, as illustrated in FIG. 1, each of the first and second areas SA1 and SA2 may have a trapezoidal shape, e.g., to provide a chamber portion C as will be discussed in more detail below with reference to FIG. 8. In the present embodiment, the first area SA1 and the second area SA2 may be curved at an approximately right angle with respect to the main area MA but the disclosure is not limited thereto. The curved angle of the first area SA1 and the second area SA2 with respect to the main area MA may be variously set according to necessity.

The main area MA of the flexible substrate 100 may be a front surface viewed from user's eyes. The display unit 200 may be positioned over the main area MA. The main area MA may be formed in a polygon having a plurality of apexes and sides. In the present embodiment, an example of the main area MA formed in a rectangular shape having four apexes and sides will be described.

The main area MA may have a first side S1, e.g., along the x-axis, and a second side S2, e.g., along the y-axis, that share an apex A. The apex A may be one of the plurality of apexes of the main area MA. In the present embodiment, since the main area MA has the rectangular shape, the first side S1 and the second side S2 that share the apex A may be at a right angle.

The first area SA1 and the second area SA2 may be positioned in side surfaces of the main area MA. The first area SA1 may share the first side S1 with the main area MA. The second area SA2 may share the second side S2 with the main area MA. As shown in FIG. 1, the first area SA1 may be bent at a preset angle by using the first side S1 as a first bending line with respect to the main area MA, e.g., the first area SA1 bends in the xz-plane. Like the first area SA1, the second area SA2 may be bent at a preset angle by using the second side S2 as a second bending line with respect to the main area MA.

The main area MA of the flexible substrate 100 may further include a third side S3 and a fourth side S4 that are respectively parallel to the first side S1 and the second side S2. Although not shown in FIG. 1, referring to FIGS. 2 and 3, the main area MA may further include a third area SA3 that shares the third side S3 with the main area MA, and a fourth area SA4 that shares the fourth side S4 with the main area MA. Like the first side S1 and the second side S2, the third side S3 and the fourth side S4 may be bent at preset angles with respect to the main area MA. In this case, the third area SA3 may be bent by using the main area MA and the third side S3 as a third bending line, and the fourth area SA4 may be bent by using the main area MA and the fourth side S4 as a fourth bending line.

The first area SA1 and the second area SA2 will be mainly described below. The third area SA3 and the fourth area S4 may be understood to be symmetrical to and have same structures as the first area SA1 and the second area SA2, respectively.

The display unit 200 may be arranged over the flexible substrate 100 and may include a plurality of pixels. For example, the display unit 200 may be an organic light emitting display unit or a liquid crystal display unit that includes a plurality of thin film transistors and pixel electrodes connected to the plurality of thin film transistors.

The display unit 200 may be arranged over the main area MA, the first area SA1, and the second area SA2 of the flexible substrate 100. That is, the display unit 200 may be positioned over not only the main area MA but also the first area SA1 and the second area SA2 that are bent in side surfaces of the main area MA. Accordingly, the flexible display apparatus according to an embodiment may include the display unit 200 in not only a front surface but also side surfaces. The display unit 200 may be arranged throughout the main area MA, the first area SA1, and the second area SA2 and may be integrally formed with the main area MA, the first area SA1, and the second area SA2. For example, as illustrated in FIGS. 1-3, the display unit 200 may cover and overlap the main area MA, and may extend over sides of the main area MA to, e.g., only, partially cover and overlap the first through fourth areas SA1 through SA4.

The display unit 200 may be spaced apart from an edge of the flexible substrate 100, e.g., the display unit 200 may leave an edge area of each of the first through fourth areas SA1 through SA4 exposed. An area including the edge of the flexible substrate 100, i.e., an area of each of the first through fourth areas SA1 through SA4 in which the display unit 200 is not arranged, may be a dead space DS. Driving circuits for driving the display unit 200 may be arranged in the dead space DS.

The dead space DS may be provided to surround edges of the display unit 200, and thus the display unit 200 may be arranged excluding at least a part of the main area MA. That is, the main area MA may have a corner area CA including the apex A at which the first side S1 and the second side S2 meet. The display unit 200 may not be arranged in the corner area CA. The corner area CA may be a part of the dead space DS. The corner area CA may have a triangular shape as shown in FIG. 1 but the disclosure is not necessarily limited thereto.

Figure 4:
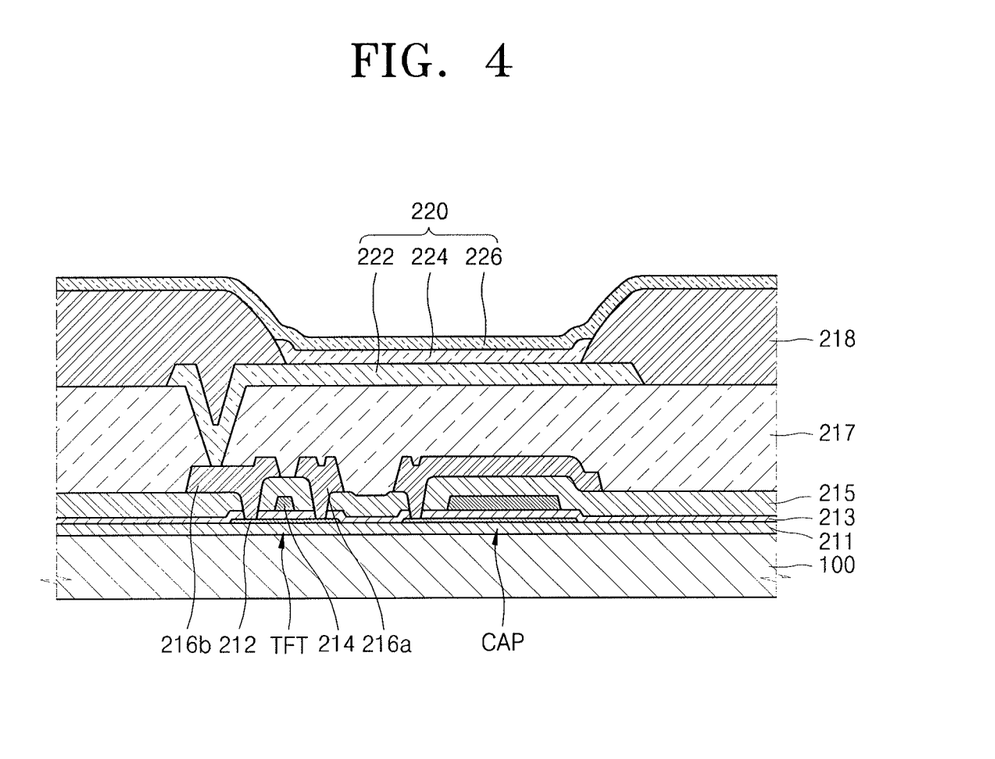
FIG. 4 illustrates a schematic cross-sectional view of a pixel included in a display unit of the flexible display apparatus of FIG. 1.

FIG. 4 is a schematic cross-sectional view of a pixel included in the display unit 200 of the flexible display apparatus of FIG. 1.

The display unit 200 according to the present embodiment may be arranged over the flexible substrate 100. A buffer layer 211, e.g., including silicon oxide or silicon nitride, may be arranged over the flexible substrate 100 in order to planarize a surface of the flexible substrate 100 or prevent impurities from permeating into a semiconductor layer 212 of a thin film transistor TFT. The semiconductor layer 212 may be positioned on the buffer layer 211.

A gate electrode 214 may be arranged above the semiconductor layer 212. A source electrode 216a and a drain electrode 216b may be electrically connected to each other according to a signal applied to the gate electrode 214. The gate electrode 214 may include a single layer or multi layers including, e.g., one or more of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu), based on adhesiveness to an adjacent layer, surface smoothness of a stacked layer, and processability.

In this regard, in order to secure insulation between the semiconductor layer 212 and the gate electrode 214, a gate insulation layer 213, e.g., including silicon oxide and/or silicon nitride, may be interposed between the semiconductor layer 212 and the gate electrode 214. An interlayer insulation layer 215 may be arranged above the gate electrode 214, and may include a single layer or multi layers, e.g., including silicon oxide or silicon nitride.

The source electrode 216a and the drain electrode 216b may be arranged above the interlayer insulation layer 215. Each of the source electrode 216a and the drain electrode 216b may be electrically connected to the semiconductor layer 212 via contact holes formed in the interlayer insulation layer 215 and the gate insulation layer 213. The source electrode 216a and the drain electrode 216b may each include a single layer or multi layers including, e.g., one or more of aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu) by taking into account conductivity.

A protective layer covering the thin film transistor TFT may be provided to protect the thin film transistor TFT having such the above structure. The protective layer may include an inorganic material, e.g., silicon oxide, silicon nitride, or silicon oxynitride.

Figure 10:
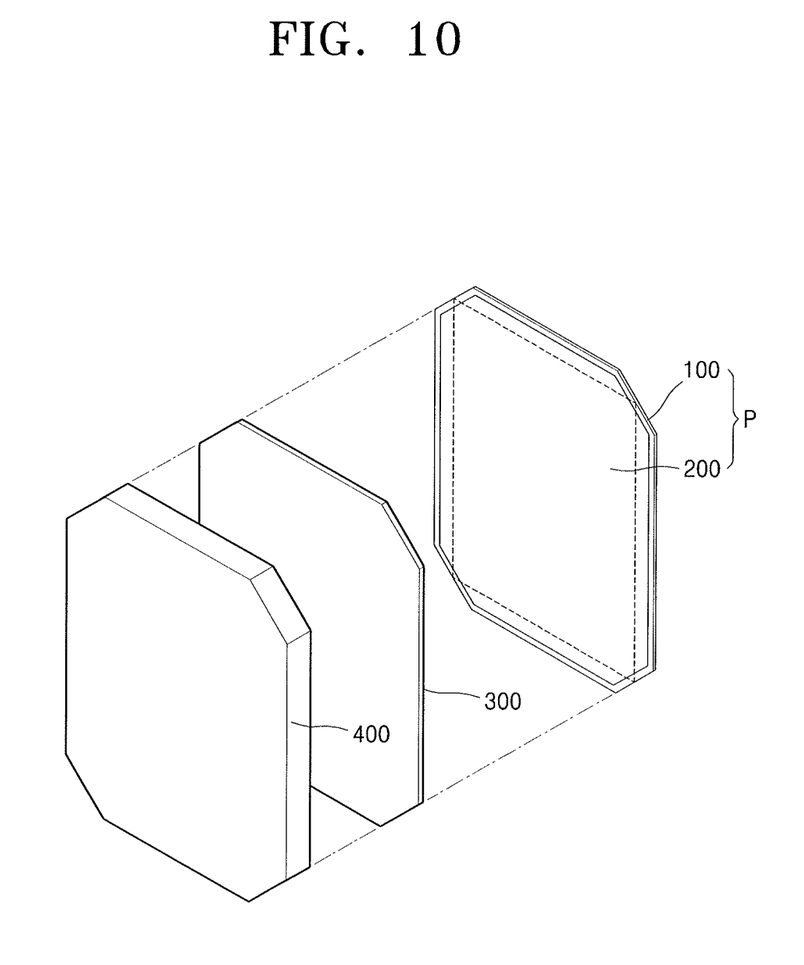

A planarization layer 217 may be arranged over the flexible substrate 100. In this case, the planarization layer 217 may be a protective layer. When an organic light-emitting device 220 is arranged above the thin film transistor TFT, the planarization layer 217 may generally planarize an upper surface of the thin film transistor TFT and protect the thin film transistor TFT and various devices. The planarization layer 217 may include, e.g., an acrylic organic material, benzocyclobutene (BCB), etc. In this regard, as shown in FIG. 10, the buffer layer 211, the gate insulation layer 213, the interlayer insulation layer 215, and the planarization layer 217 may be formed on the entire surface of the flexible substrate 100.

A pixel-defining layer 218 may be arranged above the thin film transistor TFT. The pixel-defining layer 218 may be arranged over the above-described planarization layer 217 and may have an opening. The pixel-defining layer 218 may define a pixel area over the flexible substrate 100. The pixel-defining layer 218 may include, e.g., an organic insulation layer. The organic insulation layer may include an acrylic polymer, e.g., poly(methyl methacrylate) (PMMA), polystyrene (PS), a polymer derivative containing a phenol group, an imide-based polymer, an aryl ether-based polymer, an amide-based polymer, a fluorine-based polymer, a p-xylene-based polymer, a vinyl alcohol-based polymer, and a mixture thereof.

The organic light-emitting device 220 may be arranged over the pixel-defining layer 218. The organic light-emitting device 220 may include a pixel electrode 222, an intermediate layer 224 including an emission layer (EML), and an opposite electrode 226.

The pixel electrode 222 may be a (semi)transparent electrode or a reflective electrode. When the pixel electrode 222 is a (semi)transparent electrode, the pixel electrode 222 may include, e.g., indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 222 is a reflective electrode, the pixel electrode 222 may include a reflective layer including, e.g., Ag, Mg, Al, Pt, Pd, Au, Ni, Nd, Ir, Cr, and a compound thereof, and a layer including ITO, IZO, ZnO, $In_2O_3$, IGO, or AZO. However, the disclosure is not limited thereto. The pixel electrode 222 may include various materials, and a structure of the pixel electrode 222 may be modified in various ways such as including a single layer or multi layers.

The intermediate layer 224 may be arranged in each pixel area defined by the pixel-defining layer 218. The intermediate layer 224 may include an EML that emits light according to an electrical signal. In addition to the EML, the intermediate layer 224 may include a hole injection layer (HIL) and a hole transport layer (HTL) between the EML and the pixel electrode 210, an electron transport layer (ETL) and an electron injection layer (EIL) between the EML and the opposite electrode 230, and the like stacked on one another in a single or complex structure. However, the intermediate layer 224 is not necessarily limited thereto and may have various structures.

The opposite electrode 226 covering the intermediate layer 224 including the EML and facing the pixel electrode 222 may be arranged throughout the entire surface of the flexible substrate 100. The opposite electrode 226 may be a (semi)transparent electrode or a reflective electrode.

When the opposite electrode 226 is a (semi)transparent electrode, the opposite electrode 226 may include a layer including metal with a low work function, e.g., Li, Ca, lithium fluoride/calcium (LiF/Ca), lithium fluoride/aluminum (LiF/Al), Al, Ag, Mg, and a compound thereof, and a (semi)transparent conductive layer including ITO, IZO, ZnO, $In_2O_3$, or the like. When the opposite electrode 226 is a reflective electrode, the opposite electrode 226 may include a layer including, e.g., Li, Ca, LiF/Ca, LiF/Al, Al, Ag, Mg, and a compound thereof. However, a structure and a material of the opposite electrode 226 are not limited thereto and may have various modifications.

An encapsulation layer may be further arranged over the opposite electrode 226. The encapsulation layer may have a multilayer structure including a stack of one or more inorganic layers and organic layers. The encapsulation layer may prevent impurities, e.g., moisture and oxygen, from penetrating into various devices or layers included in the display unit 200.

Figure 5:
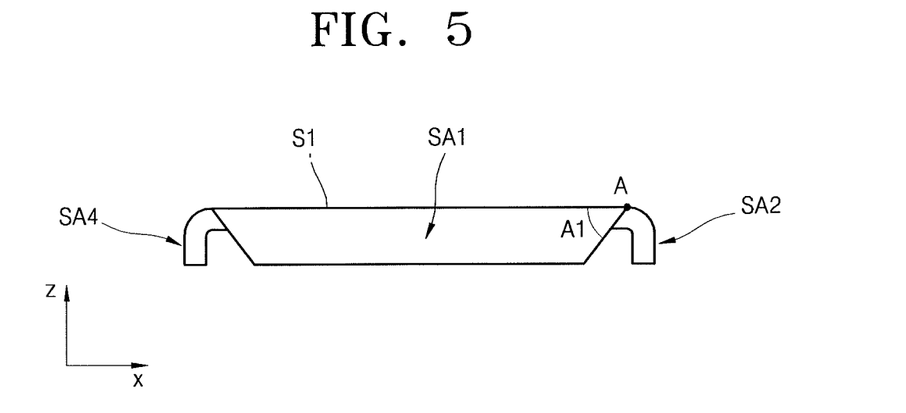
FIG. 5 illustrates a schematic right side view of the flexible display apparatus of FIG. 1.
Figure 6:
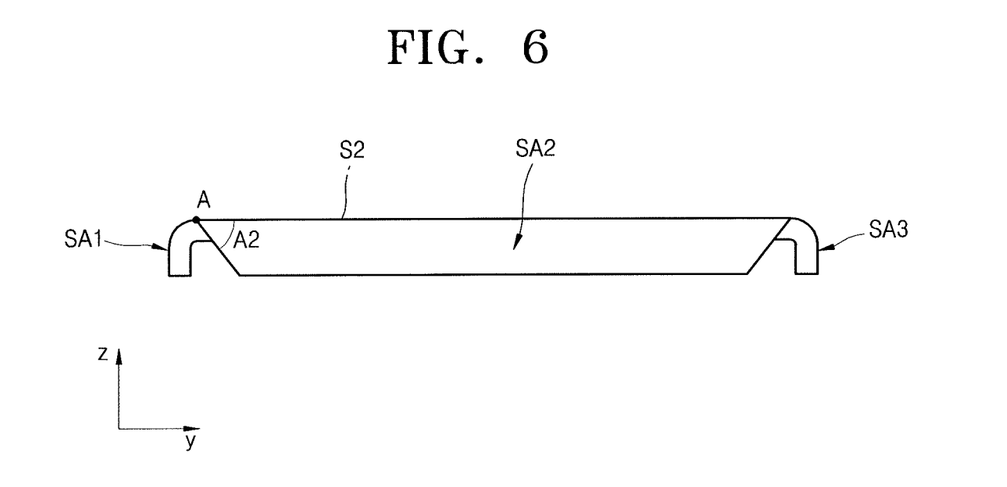
FIG. 6 illustrates a schematic front view of the flexible display apparatus of FIG. 1.

FIG. 5 is a schematic right side view of the flexible display apparatus of FIG. 1 (a view facing the first area SA1 in a bent state). FIG. 6 is a schematic front view of the flexible display apparatus of FIG. 1 (a view facing the second area SA2 in a bent state).

Referring to FIGS. 1, 5, and 6, as described above, the flexible substrate 100 of the present embodiment may have the first area SA1 and the second area SA2 that are bent in side surfaces with respect to the main area MA. In the present embodiment, each of the first area SA1 and the second area SA2 may have an internal angle that shares the apex A. That is, the first area SA1 may have a first angle A1 including the apex A, and the second area SA2 may have a second angle A2 including the apex A. In this case, each of the first angle A1 of the first area SA1 and the second angle A2 of the second area SA2 may make an acute angle.

Figure 8:
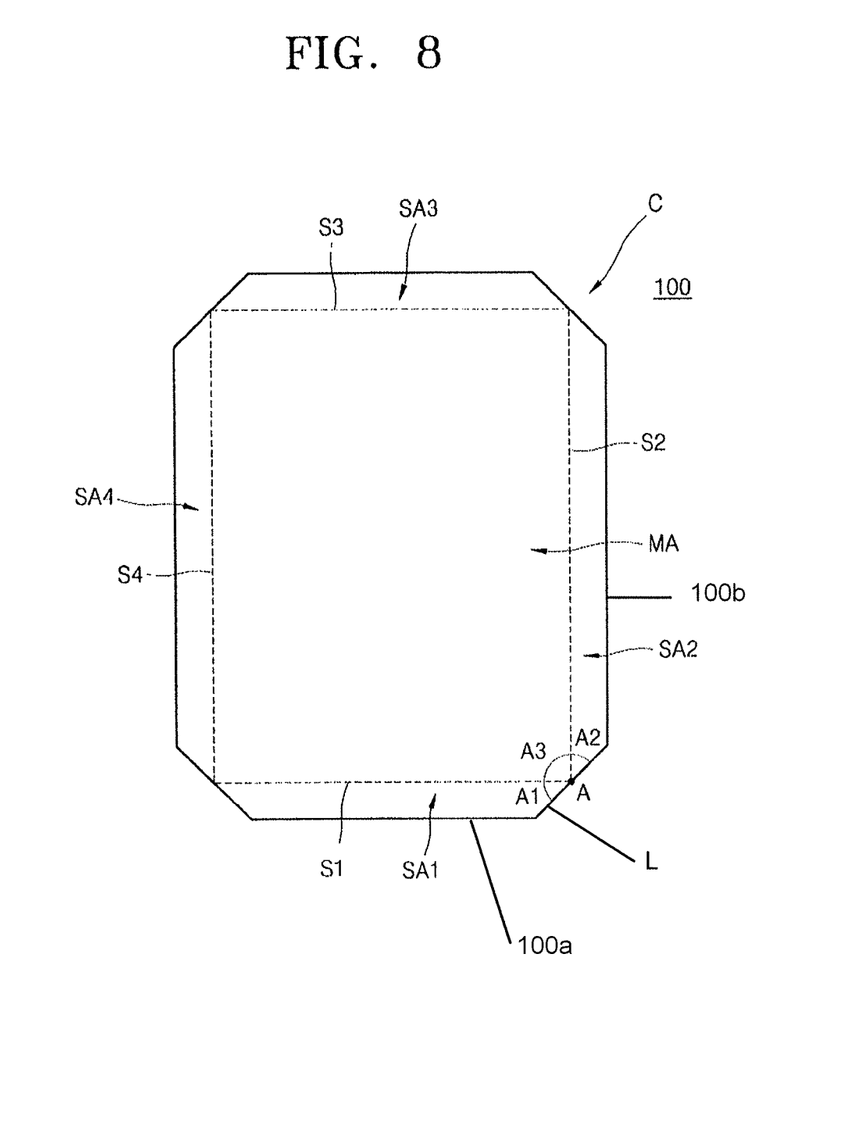
FIGS. 8 through 10 illustrate schematic plan and exploded perspective views of stages in a process of manufacturing a flexible display apparatus according to an embodiment.

For example, a sum of the first angle A1 and the second angle A2 may be 90° because the main area MA has a rectangular shape and a third angle A3 that is an internal angle of the main area MA including the apex A is a right angle (FIG. 8). In another example, the main area MA may be formed in a polygonal shape other than the rectangular shape, with the third angle A3 of the main area MA including the apex A not being a right angle, and a sum of the first through third angles A1 through A3 being 180°. That is, when the first angle A1, the second angle A2, and the third angle A3 are respectively internal angles of the first area SA1, the second area SA2, and the main area MA, i.e., a 3-dimensional (3D) surface with respect to the apex A of the main area MA, a sum of the first angle A1, the second angle A2, and the third angle A3 may be 180°.

In other words, when it is assumed that the flexible substrate 100 is unfolded on a plane in consideration of the flexible substrate 100 that is not yet bent (e.g., FIG. 8), a straight line L may cross the apex A of the main area MA. The straight line may form one side of the first area SA1 and the second area SA2. That is, the first angle A1 of the first area SA1, the second angle A2 of the second area SA2, and the third angle A3 of the main area MA that include the apex A with respect the straight line L may be positioned along one side of the straight line. Thus, the sum of the first angle A1, the second angle A2, and the third angle A3 that are respectively internal angles of the first area SA1, the second area SA2, and the main area MA may be 180°. In the present embodiment, although the third angle A3 is a right angle, and each of the first angle A1 and the second angle A2 is 45°, the first angle A1 and the second angle A2 may be the same or different from each other.

In such a side surface display apparatus in which the display unit 200 is positioned to partially overlap side surfaces, it is necessary to apply a design suitable to the flexible substrate 100. When parts of the side surface display apparatus that are not adjacent to each other, e.g., that are not symmetrical to each other, are bent, the flexible substrate 100 does not need a separate design.

However, like an embodiment, when adjacent side surfaces, i.e., the first area SA1 and the second area SA2, are simultaneously bent, there is a problem in that it is necessary to cut out or off the first area SA1 and the second area SA2 in order to implement the main area MA, the first area SA1, and the second area SA2 in a 3D way. In this case, in the flexible display apparatus according to an embodiment, corners of the flexible substrate 100 may be cut off along the straight line crossing the apex A of the main area MA of the flexible substrate 100, and thus the sum of the first angle A1 of the first area SA1, the second angle A2 of the second area SA2, and the third angle A3 of the main area MA that are implemented in the 3D way with respect to the apex A of the main area MA of the flexible substrate 100 may be 180°, thereby substantially reducing a defect rate due to cracks of various inorganic and organic layers in the apex A of the main area MA on which stress concentrates.

Figure 7:
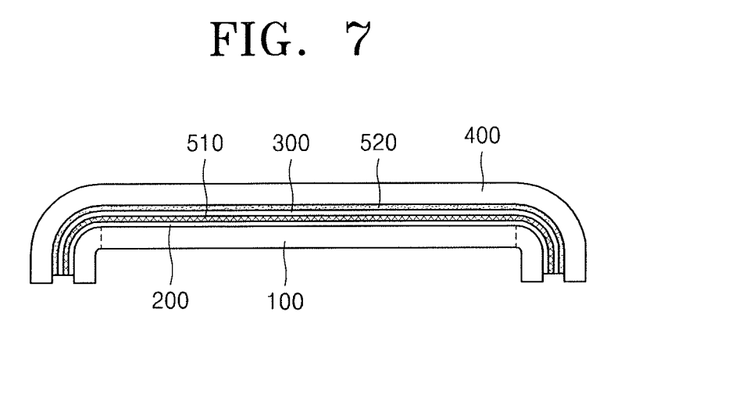
FIG. 7 illustrates a schematic cross-sectional view of a flexible display apparatus according to an embodiment.

FIG. 7 is a schematic cross-sectional view of a flexible display apparatus according to an embodiment.

Referring to FIG. 7, the flexible display apparatus according to an embodiment may include the display unit 200 arranged over the flexible substrate 100, a touch screen panel 300 arranged over the display unit 200, and a cover window 400.

The touch screen panel 300 may be arranged over the display unit 200. As shown in FIG. 7, an adhesive layer 510 may be interposed between the display unit 200 and the touch screen panel 300. The adhesive layer 510 may include, e.g., an optically clear adhesive (OCA) and/or optically clear resin (OCR). In addition to the adhesive layer 510, a separate functional layer, e.g., a polarization layer, may be interposed between the display unit 200 and the touch screen panel 300.

A sensor unit may be provided in the touch screen panel 300 to manipulate the display unit 200 through touch. The touch screen panel 300 according to the present embodiment may correspond to a shape of the flexible substrate 100. That is, the touch screen panel 300 may also be formed in accordance with the flexible substrate 100, e.g., to partially extend over and cover the first through fourth areas SA1 through SA4. The flexible display apparatus according to an embodiment may function as a full-touch display apparatus that needs no external buttons, since the flexible display apparatus is implemented as a side surface display apparatus having four side surfaces as described above. Thus, the touch screen panel 300 may also be provided in accordance with the flexible substrate 100.

The cover window 400 may be arranged over the touch screen panel 300. As shown in FIG. 7, an adhesive layer 520 may be interposed between the cover window 400 and the touch screen panel 300. The adhesive layer 520 may include, e.g., an OCA and/or OCR. In addition to the adhesive layer 520, other layers may be interposed between the cover window 400 and the touch screen panel 300. The cover window 400 may include a transparent material, e.g., a glass material or a plastic material.

Like the above-described touch screen panel 300, the cover window 400 may correspond to the shape of the flexible substrate 100, e.g., to partially extend over and cover the first through fourth areas SA1 through SA4. Including the display unit 200 arranged over the flexible substrate 100, the touch screen panel 300 and the cover window 400 may also be formed in accordance with the shape of the flexible substrate 100, and thus it is possible to implement a 3D side surface display apparatus having adjacent side surfaces. In this case, cracks and stress concentration of the touch screen panel 300 and the cover window 400 may be removed in a part corresponding to the main area MA, the first area SA1, and the second area SA2, and thus it is possible to implement a reliable flexible display apparatus.

Although a flexible display apparatus has been mainly described above, the disclosure is not limited thereto. For example, a method of manufacturing such a flexible display apparatus may also be within the scope of the disclosure.

Figure 9:
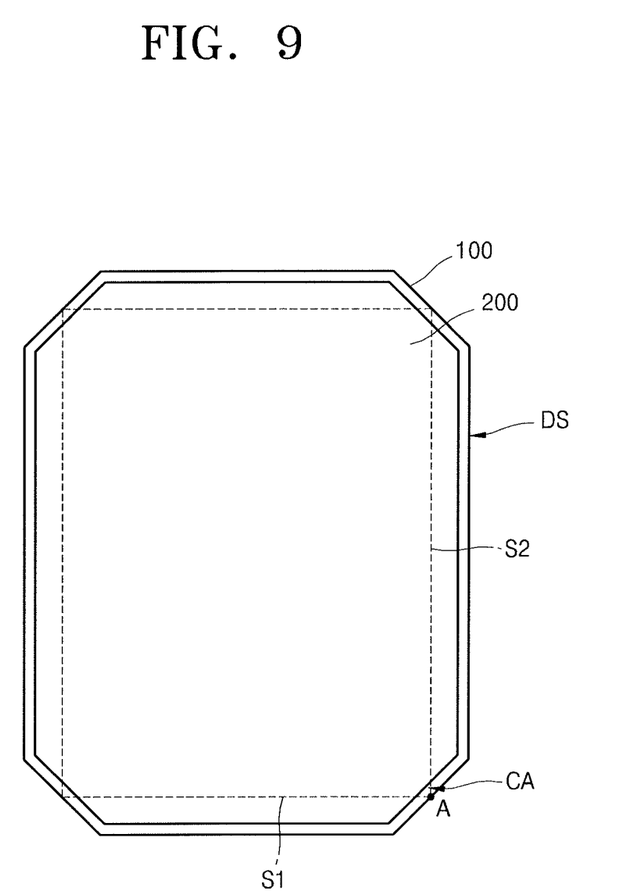

FIGS. 8 through 10 are schematic plan and exploded perspective views for describing stages in a process of manufacturing a flexible display apparatus according to an embodiment.

Referring to FIG. 8, the flexible substrate 100 may be performed. The flexible substrate 100 may have a flexible property, e.g., include a material exhibiting flexibility, and may include various materials, e.g., a thin film glass material, a metal material, or a plastic material, e.g., PEN, PET, PI, etc.

The flexible substrate 100 of the present embodiment may include the main area MA positioned in a center portion and the first area SA1 through fourth area SA4 that surround the main area MA and are positioned at edge portions, as shown in FIG. 8. In the flexible display apparatus according to the present embodiment, the first area SA1 through fourth area SA4 may function as side surface displays. In the present embodiment, the main area MA may have an approximately rectangular shape, but the disclosure is not limited thereto. The main area MA may have various polygonal shapes.

The main area MA may have the first side S1 and the second side S2 that meet at the apex A. The first area SA1 may be defined as an area that shares the first side S1 with the main area MA. The second area SA2 may be defined as an area that shares the second side S2 with the main area MA. Likewise, the third area SA3 and the fourth area SA4 may be symmetrical to the first area SA1 and the second area SA2, so the third area SA3 may be defined as an area that shares the third side S3 with the main area MA, and the fourth area SA4 may be defined as an area that shares the fourth side S4 with the main area MA. The third side S3 and the fourth side S4 may be symmetrically the same as the first side S1 and the second side S2.

The first area SA1 of the flexible substrate 100 may have the first angle A1 including the apex A, and the second area SA2 may have the second angle A2 including the apex A. For example, as illustrated in FIG. 8, the first area SA1 of the flexible substrate 100 may be defined between the first side S1 and a first outermost edge 100a of the flexible substrate 100 (which are parallel to each other), and between two lines L that connect opposite edges of the first side S1 to the first outermost edge 100a. Similarly, as illustrated in FIG. 8, the second area SA2 of the flexible substrate 100 may be defined between the second side S2 and a second outermost edge 100b of the flexible substrate 100 (which are parallel to each other), and between two lines L that connect opposite edges of the second side S2 to the second outermost edge 100b. For example, a single line L may intersect an intersection point of the first and second sides S1 and S2 (apex A) to define side edges of the first and second areas SA1 and SA2 to be collinear with each other. Accordingly, the first angle A1 is defined in the area SA1 between the line L and the first side S1, and the second angle A2 is defined in the second area SA2 between the line L and the second side S2.

In the present embodiment, each of the first angle A1 of the first area SA1 and the second angle A2 of the second area SA2 may be an acute angle. In the present embodiment, a sum of the first angle A1 and the second angle A2 may be 90° because the main area MA has a rectangular shape and the third angle A3, which is an internal angle of the main area MA including the apex A, is a right angle.

In another embodiment, the main area MA may be formed in a polygonal shape other than the rectangular shape. In this case, the third angle A3 of the main area MA including the apex A may not be a right angle. Thus, in this case, when the first angle A1, the second angle A2, and the third angle A3 are respectively internal angles of the first area SA1, the second area SA2, and the main area MA, i.e., a 3D surface with respect to the apex A of the main area MA, a sum of the first angle A1, the second angle A2, and the third angle A3 may be 180°.

In other words, when it is assumed that the flexible substrate 100 is unfolded on a plane in consideration of the flexible substrate 100 that is not yet bent, the straight line L may cross the apex A of the main area MA. The straight line L may form one side of the first area SA1 and the second area SA2. That is, the first angle A1 of the first area SA1, the second angle A2 of the second area SA2, and the third angle A3 of the main area MA that include the apex A with respect the straight line may be positioned in one side of the straight line. Thus, the sum of the first angle A1, the second angle A2, and the third angle A3 that are respectively internal angles of the first area SA1, the second area SA2, and the main area MA may be 180°. In the present embodiment, although the third angle A3 is a right angle, and each of the first angle A1 and the second angle A2 is 45°, the first angle A1 and the second angle A2 may be the same or different from each other.

For example, the flexible substrate 100 may be formed in the above-described shape initially. In another example, the flexible substrate 100 may have the above-described shape by cutting and processing a mother flexible substrate having a shape different from the flexible substrate 100. When the flexible substrate 100 is formed by cutting and processing a mother flexible substrate having a different shape, the operation of preparing for the flexible substrate 100 may include having a mother flexible substrate, e.g., with a polygonal shape, including sides and corners at which the sides meet, cutting corners of the mother flexible substrate, and forming a chamfer C.

Referring to FIGS. 8 and 9, the display unit 200 may be formed over the flexible substrate 100 and may include a plurality of pixels. The display unit 200 may be arranged over the main area MA, the first area SA1, and the second area SA2 of the flexible substrate 100. That is, the display unit 200 may be positioned over not only the main area MA but also over parts of the first area SA1 through fourth area SA4 that are bent at side surfaces of the main area MA. Accordingly, the flexible display apparatus according to an embodiment may include the display unit 200 not only in a front surface but also at side surfaces. The display unit 200 may be arranged throughout the main area MA, and the first area SA1 through the fourth area SA4, and may be integrally formed with the main area MA, and the first area SA1 through the fourth area SA4 as described above.

As illustrated in FIG. 9, the display unit 200 may be spaced apart from an edge of the flexible substrate 100. An area including the edge of the flexible substrate 100 in which the display unit 200 is not arranged may be the dead space DS, as described previously. Driving circuits for driving the display unit 200 may be arranged in the dead space DS.

The dead space DS may be provided to surround edges of the display unit 200, and thus the display unit 200 may be arranged to exclude at least a part of the main area MA, i.e., to exclude the corner area CA with the apex A. That is, the main area MA may have the corner area CA including the apex A, at which the first side S1 and the second side S2 meet. The display unit 200 may not be arranged in the corner area CA. The corner area CA may be a part of the dead space DS. The corner area CA may have a triangular shape as shown in FIG. 9, but the disclosure is not necessarily limited thereto Thereafter, referring to FIGS. 7 and 10, the touch screen panel 300 and the cover window 400 may be formed over a display panel P. Referring to FIGS. 7 and 10, the touch screen panel 300 may be arranged over the display unit 200. The adhesive layer 510 may be interposed between the display unit 200 and the touch screen panel 300. The cover window 400 may be formed over the touch screen panel 300. The adhesive layer 520 may be interposed between the cover window 400 and the touch screen panel 300. The adhesive layers 510 and 520 may include a material such as OCA and OCR. In addition to the adhesive layer 510, a separate functional layer, e.g., a polarization layer, may be interposed between the display unit 200 and the touch screen panel 300. In addition to the adhesive layer 520, other layers may be interposed between the cover window 400 and the touch screen panel 300. The cover window 400 may include a transparent material, e.g., a glass material or a plastic material.

The touch screen panel 300 and the cover window 400 may correspond to the shape of the flexible substrate 100. Including the display panel P, the touch screen panel 300 and the cover window 400 may also be formed in accordance with the above-described shape of the flexible substrate 100, and thus it is possible to implement a 3D side surface display apparatus having adjacent side surfaces. In this case, cracks and stress concentration of the touch screen panel 300 and the cover window 400 may be removed in a part corresponding to the main area MA, the first area SA1, and the second area SA2, and thus it is possible to implement a reliable flexible display apparatus.

Thereafter, an operation of bending the main area MA and the first area SA1 of the flexible substrate 100 at a preset angle by using the first side S1 of the main area MA as a first bending line may be performed. Likewise, an operation of bending the main area MA and the second area SA2 of the flexible substrate 100 at a preset angle by using the second side S2 of the main area MA as a second bending line may be performed. The same operation may be performed on the third area SA3 and the fourth area SA4. The flexible display apparatus having the bent first through fourth areas SA1 through SA4 may be implemented in a shape shown in FIG. 1.

In such a side surface display apparatus, in which the display unit 200 is positioned both on a front surface and on side surfaces of the flexible substrate 100, the flexible substrate 100 according to embodiments includes a suitable design to improve display on the side surfaces. That is, when parts of the side surface display apparatus that are not adjacent to each other, e.g., that are symmetrical to each other, are bent, the flexible substrate 100 does not need a separate design. However, when adjacent side surfaces, i.e., the first area SA1 and the second area SA2, are simultaneously bent, corners of the flexible substrate 100 according to embodiments may be removed to improve display on the side surfaces.

That is, it is necessary to cut out or off the first area SA1 and the second area SA2 in order to implement the main area MA, the first area SA1, and the second area SA2 in a 3D way. In this case, in the flexible display apparatus according to an embodiment, corners of the flexible substrate 100 may be cut off along the straight line L crossing the apex A of the main area MA of the flexible substrate 100, and thus a sum of the first angle A1 of the first area SA1, the second angle A2 of the second area SA2, and the third angle A3 of the main area MA that are implemented in the 3D way with respect to the apex A of the main area MA of the flexible substrate 100 may be 180°, thereby substantially reducing a defect rate due to cracks of various inorganic and organic layers in the apex A of the main area MA on which stress concentrates.

By way of summation and review, in a general flexible display apparatus, when a part of a display panel is bent, various defects and a reliability problem may occur in the bending part. In contrast, according to embodiments, a flexible display apparatus may include a flexible substrate with a display unit thereon that have corners thereof removed, thereby substantially reducing a defect rate due to cracks at stress points in a bending area. These above embodiments may be implemented by using a system, a method, a computer program, or a combination thereof.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A flexible display apparatus, comprising:
    a flexible substrate having at least one of a first chamfered corner and including:
        a main area having an apex at which a first side and a second side meet,
        a first area that shares the first side with the main area, and
        a second area that shares the second side with the main area,
        wherein a first angle of the first area and a second angle of the second area that share the apex are acute angles;
    a display unit including a main display portion on the main area, a first display portion on the first area and a second display portion on the second area, the first area and the second area are bent in side surfaces with respect to the main area, and the first area and the second area include side surface displays;
    a touch unit disposed over the display unit and partially extending over the first area and the second area; and
    a cover window disposed over the touch unit and partially extending over the first area and the second area,
    wherein at least one corner of each of the first and second display portions is an acute angle,
    wherein the display unit includes at least one of a second chamfered corner corresponding to the first chamfered corner in a top view, and
    wherein the touch unit includes at least one of a third chamfered corner corresponding to the second chamfered corner, and the cover window includes at least one of a fourth chamfered corner corresponding to the third chamfered corner in a top view.

2. The flexible display apparatus as claimed in claim 1, wherein:
    the first area bends relatively to the main area along the first side at a first preset angle,
    the second area bends relatively to the main area along the second side at a second preset angle, and
    the display unit extends beyond the first and second sides to overlap parts of the first and second areas.

3. The flexible display apparatus as claimed in claim 1, wherein the main area has a third angle that is an internal angle including the apex, and a sum of the first angle, the second angle, and the third angle is 180°.

4. The flexible display apparatus as claimed in claim 1, wherein the display unit continuously overlaps the main area and parts of the first and second areas, the display unit being spaced apart from an edge of the flexible substrate by a predetermined distance.

5. The flexible display apparatus as claimed in claim 4, wherein:
    the display unit is spaced apart from the edge of the flexible substrate along an entire perimeter of the flexible substrate, as viewed in a top view, and
    the main area of the flexible substrate includes a corner area having the apex at which the first side and the second side meet, the display unit being spaced apart from the corner area.

6. The flexible display apparatus as claimed in claim 5, wherein, when viewed in the top view, the corner area extends beyond the display unit and has a triangular shape beyond the display unit, the triangular shape including the apex and a side of the display unit defining a base of the triangular shape.

7. The flexible display apparatus as claimed in claim 1, wherein the touch unit corresponds to a shape of the flexible substrate.

8. The flexible display apparatus as claimed in claim 7, wherein the cover window corresponds to the shape of the flexible substrate.

9. The flexible display apparatus as claimed in claim 1, wherein the display unit is integral with the main area, the first area, and the second area of the flexible substrate.

10. The flexible display apparatus as claimed in claim 1, wherein:
    the main area of the flexible substrate has a polygonal shape, the first and second areas being continuous with and surrounding the main area, and
    each of the first and second areas has a trapezoidal shape, each of the first and second areas being bent with respect to the main area at a non-zero angle.

11. A method of manufacturing a flexible display apparatus, the method comprising:
    forming a flexible substrate having at least one of a first chamfered corner and including a main area having an apex at which a first side and a second side meet, a first area that shares the first side with the main area, and a second area that shares the second side with the main area, such that a first angle of the first area and a second angle of the second area that share the apex are acute angles;
    forming a display unit including a main display portion on the main area, a first display portion on the first area and a second display portion on the second area;
    forming a touch unit over the display unit to partially extend over the first area and the second area;
    forming a cover window over the touch unit to partially extend over the first area and the second area;
    forming the first area and the second area as bent in side surfaces with respect to the main area;
    forming the first area and the second area to include side surface displays; and
    forming at least one corner of each of the first and second display portions as an acute angle,
    wherein the display unit includes at least one of a second chamfered corner in a top view, and
    wherein the touch unit includes at least one of a third chamfered corner corresponding to the second chamfered corner, and the cover window includes at least one of a fourth chamfered corner corresponding to the third chamfered corner in a top view.

12. The method as claimed in claim 11, further comprising:
    preparing a mother flexible substrate having a polygonal shape with sides and corners at which the sides meet; and
    forming a chamfer by cutting the corners of the mother flexible substrate to form the flexible substrate, such that the formed chamfer extends along chamfered corners of the display unit.

13. The method as claimed in claim 12, wherein forming the chamfer includes cutting a straight line such that the corners are cut into a triangular shape.

14. The method as claimed in claim 11, wherein forming the flexible substrate includes forming the main area with a third angle that is an internal angle including the apex, such that a sum of the first angle, the second angle, and the third angle is 180°.

15. The method as claimed in claim 11, wherein forming the display unit includes positioning the display unit to continuously overlap the entire main area and parts of the first and second areas, and be spaced apart from an edge of the flexible substrate by a predetermined distance.

16. The method as claimed in claim 15, wherein forming the flexible substrate includes forming the main area with a corner area having the apex, and forming the display unit includes arranging the display unit to be spaced apart from the corner area.

17. The method as claimed in claim 16, wherein forming the main area with the corner area includes forming the corner area with a triangular shape having the apex, such that, when viewed in a top view, the triangular shape extends beyond and is exposed by chamfered corners of the display unit.

18. The method as claimed in claim 11, wherein the touch unit corresponds to a shape of the flexible substrate over the display unit.

19. The method as claimed in claim 18, wherein the cover window correspond s to the shape of the flexible substrate over the touch unit.

20. The method as claimed in claim 19, further comprising:
- bending the first area relatively to the main area at a first preset angle along the first side; and
- bending the second area relatively to the main area at a second preset angle along the second side, such that the display unit bends and extends beyond the first and second sides to overlap parts of the first and second areas.

* * * * *